(12) United States Patent
Fastow

(10) Patent No.: US 7,910,976 B2
(45) Date of Patent: Mar. 22, 2011

(54) HIGH DENSITY NOR FLASH ARRAY ARCHITECTURE

(76) Inventor: Richard Fastow, Cupertino, CA (US)

( * ) Notice: Subject to any disclaimer, the term of this patent is extended or adjusted under 35 U.S.C. 154(b) by 911 days.

(21) Appl. No.: 11/823,518

(22) Filed: Jun. 28, 2007

(65) Prior Publication Data

US 2009/0003060 A1 Jan. 1, 2009

(51) Int. Cl.
 H01L 29/788 (2006.01)
 H01L 21/82 (2006.01)
(52) U.S. Cl. .............. 257/316; 257/E27.103; 438/128
(58) Field of Classification Search .......... 257/316, 257/E21.682, E27.103; 438/128
 See application file for complete search history.

(56) References Cited

U.S. PATENT DOCUMENTS

| | | | | |
|---|---|---|---|---|
| 5,742,787 | A | | 4/1998 | Talreja .................. 711/103 |
| 6,080,624 | A | * | 6/2000 | Kamiya et al. ............ 438/257 |
| 6,396,096 | B1 | | 5/2002 | Park et al. ................ 257/296 |
| 6,495,470 | B2 | | 12/2002 | Sadjadi et al. ............ 438/738 |
| 6,528,843 | B1 | * | 3/2003 | Wu .......................... 257/315 |
| 7,820,516 | B2 | * | 10/2010 | Yang et al. ................ 438/294 |
| 2002/0064898 | A1 | * | 5/2002 | Adachi et al. ............ 438/41 |
| 2003/0122181 | A1 | * | 7/2003 | Wu .......................... 257/315 |
| 2003/0156460 | A1 | * | 8/2003 | Wu .......................... 365/185.33 |
| 2004/0130947 | A1 | * | 7/2004 | Fan et al. ................ 365/185.05 |
| 2005/0139935 | A1 | * | 6/2005 | Lee .......................... 257/390 |
| 2006/0018181 | A1 | * | 1/2006 | Matsunaga et al. ...... 365/230.05 |
| 2006/0197136 | A1 | * | 9/2006 | Futatsuyama et al. ..... 257/314 |
| 2006/0231822 | A1 | * | 10/2006 | Kim ........................ 257/1 |
| 2006/0276032 | A1 | * | 12/2006 | Arakawa et al. .......... 438/637 |
| 2007/0036016 | A1 | * | 2/2007 | Takeuchi et al. .......... 365/212 |
| 2007/0268746 | A1 | * | 11/2007 | Choi et al. ................ 365/185.05 |

OTHER PUBLICATIONS

M. Wei, et al., "A Scalable Self-Aligned Contact NOR Flash Technology," Jun. 12, 2007, pp. 1-2.

* cited by examiner

Primary Examiner — Kiesha R Bryant
Assistant Examiner — Igwe U Anya
(74) Attorney, Agent, or Firm — Trop, Pruner & Hu, P.C.

(57) ABSTRACT

In one embodiment of the invention, a memory includes wordline jogs and adjacent spacers. Spacers from different wordlines may contact one another on either side of a drain contact and consequently isolate and self-align the contact in the horizontal and vertical directions.

17 Claims, 2 Drawing Sheets

HIGH DENSITY NOR FLASH ARRAY ARCHITECTURE

BACKGROUND

NOR flash memory architecture typically includes an array of wordlines, bitlines, and source rails. When self-aligned contact (SAC) techniques are utilized, spacers may be formed adjacent to the wordlines to provide guides for drain contacts. However, the spacers only provide isolation or self-alignment in the vertical direction. In other words, the contacts are only self-aligned perpendicular to the wordlines by the wordline spacer. In the direction parallel to the wordlines the contacts are not self-aligned and require a masking step for isolation.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

Figure 1:
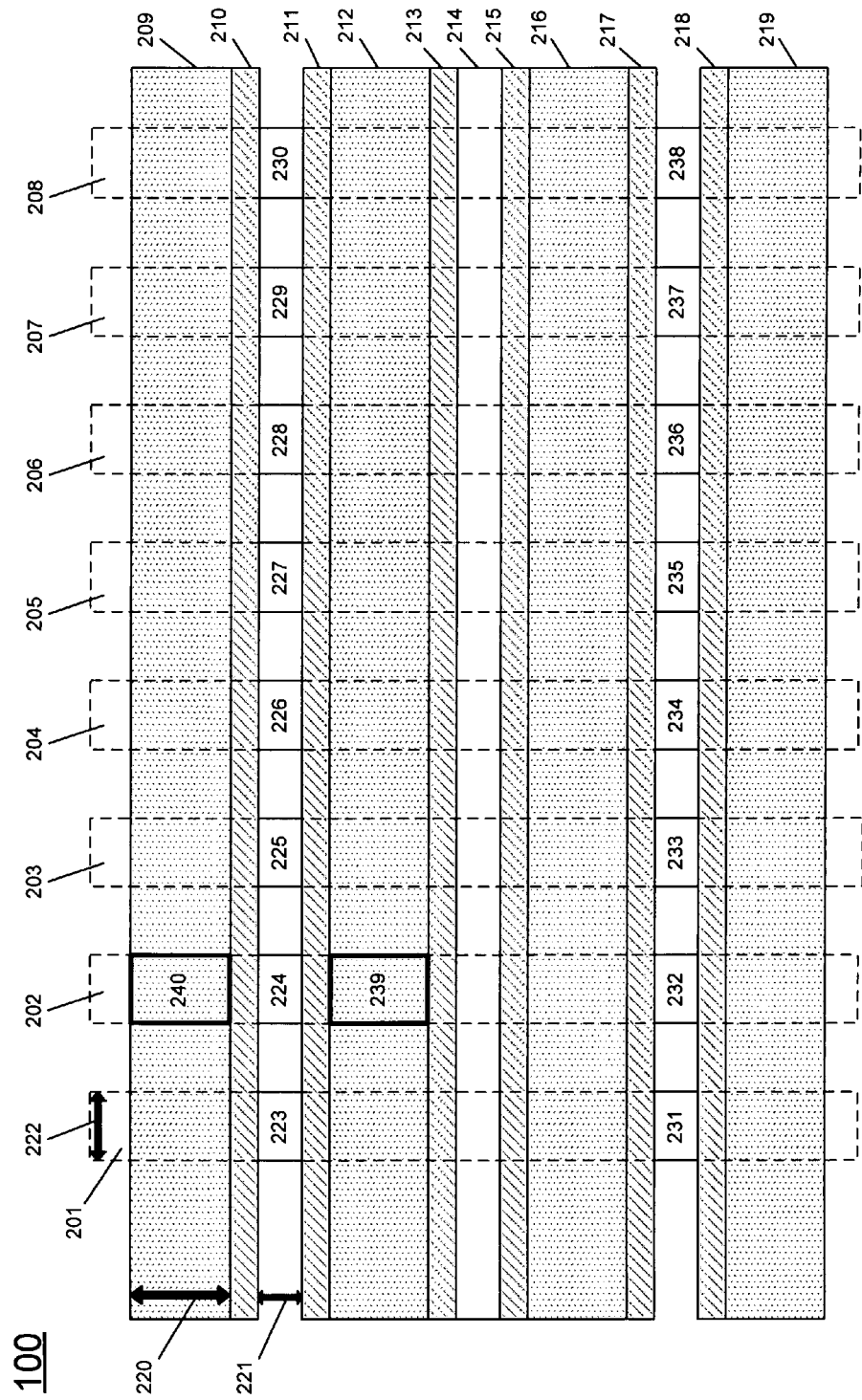
FIG. 1 is top view of a traditional memory device.

FIG. 1 is top view of a traditional SAC NOR flash memory array 100. The array 100 includes bitlines 201, 202, 203, 204, 205, 206, 207, 208, wordlines 209, 212, 216, 219 adjacent to spacers 210, 211, 213, 215, 217, 218, common source rail 214, and drain contacts 223, 224, 225, 226, 227, 228, 229, 230, 231, 232, 233, 234, 235, 236, 237, 238. The wordlines may be 110 nm+/−15 nm in the vertical direction (parallel to bitlines). Bitlines may be formed ½ pitch wide (e.g., 58 nm) in the horizontal direction parallel to wordlines. Oxide spacers may be 30 nm wide in the vertical direction. Drain contact 223, for example, may be 58 nm (horizontal)×40 nm (vertical). Each drain contact (e.g., 224) is shared by two flash memory cells (e.g., 239, 240). To access memory cell 239, bitline 202 and wordline 212 are selected.

The drain contacts (e.g., 223) may be self-aligned perpendicular to the wordlines 209, 212, 216, 219 by the wordline spacers 210, 211, 213, 215, 217, 218. In the direction parallel to the wordlines, however, the contacts are not self-aligned and require a masking step to prevent them from, for example, shorting with one another.

Figure 2:
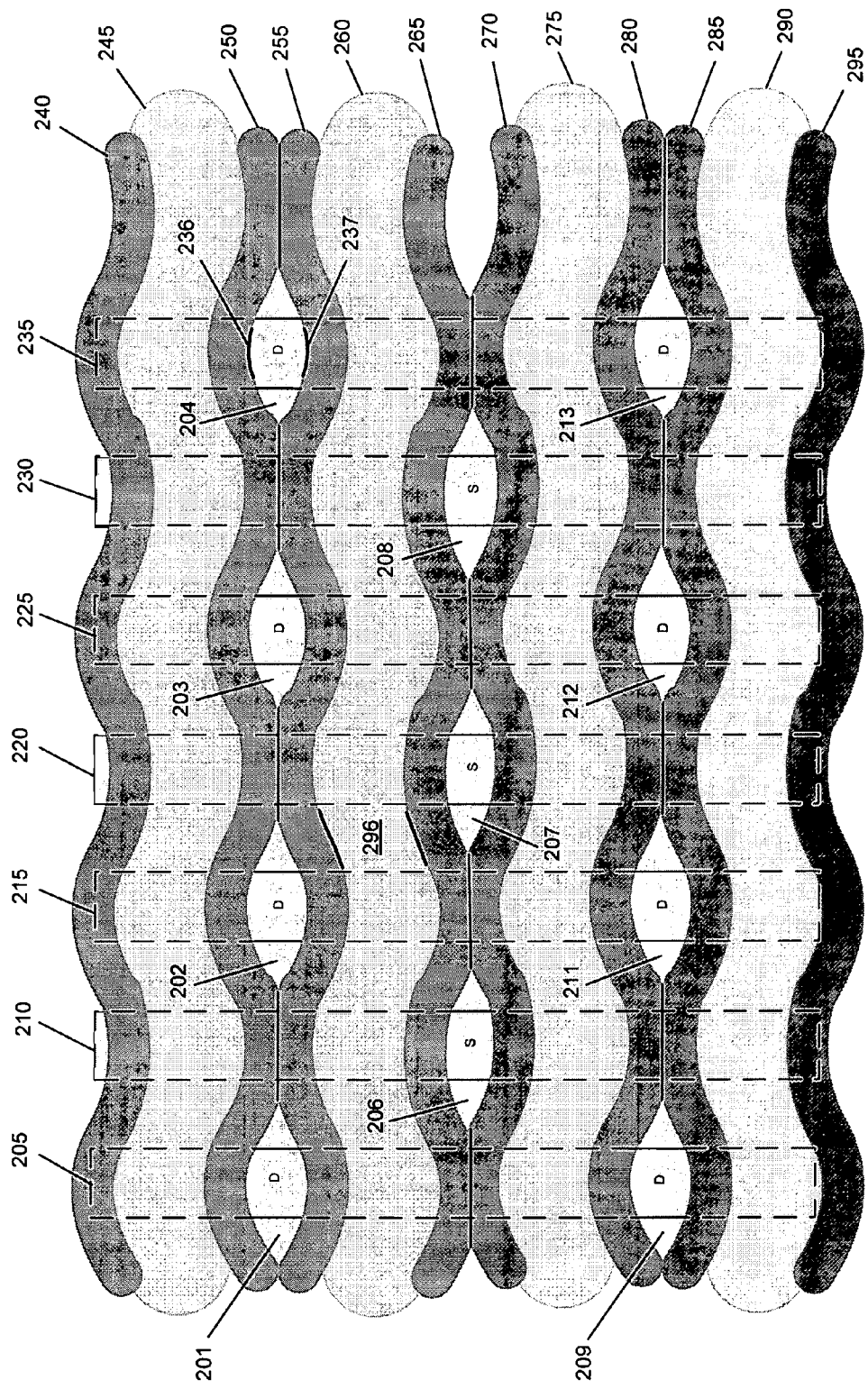
FIG. 2 is a top view of a memory device in one embodiment of the invention.

FIG. 2 is a top view of a memory device in one embodiment of the invention. NOR flash array 200 includes spacers (e.g., oxide) 240, 250, 255, 265, 270, 280, 285, 295 formed adjacent to wordlines 245, 260, 275, 290. The memory also includes bitlines 205, 215, 225, 235, source lines 210, 220, 230, drain contacts 201, 202, 203, 204, 209, 211, 212, 213, and source contacts 206, 207, 208.

In the absence of a common source rail, individual source contacts 206, 207, 208 may be utilized to implement a virtual ground architecture in one embodiment of the invention. In other words, without a dedicated source rail (e.g., 214 of FIG. 1) the source contacts may operate as virtual grounds. The common source rail is replaced by source contacts having the same dimension as the drain contacts. The source contacts 206, 207, 208 are staggered with respect to the drain contacts 201, 202, 203, 204, 209, 211, 212, 213, thereby allowing a given cell (e.g., 296) to be accessed by selecting a drain contact (bitline), a source contact (sourceline), and a wordline. To select a memory cell (e.g., 296), bitline 215, source line 220, and wordline 260 are selected.

In one embodiment of the invention, memory 200 is created using SAC techniques to form the spacers 240, 250, 255, 265, 270, 280, 285, 295. Periodic wordline jogs, bends, or kinks are utilized to form wordlines and spacers around the source and drain contacts. For example, spacers 250, 255 directly contact one another on either side of drain contact 202. In doing so, contact 202 is isolated and self-aligned in two directions. In other words, the source and drain contact openings may be self-aligned in two directions, both parallel (i.e., horizontal) and perpendicular (i.e., vertical) to the wordlines. Thus, unlike traditional NOR flash memories utilizing SAC techniques, the contacts may not require a masking step to define them in the vertical direction (direction parallel to the wordlines). This facilitates contact definition and filling.

In one embodiment of the invention, the source (e.g., 206) and/or drain contact (e.g., 202) dimensions may be larger than, for example, traditional drain contacts (e.g., 223 of FIG. 1). More specifically, use of a virtual ground architecture allows drain contacts to be expanded in the horizontal direction. In one embodiment of the invention, the drain contacts 201, 202, 203, 204, 209, 211, 212, 213 may be formed at 2×½ pitch wide (e.g., 2×58 nm=116 nm) and may be shared by four flash cells. Furthermore, the rounded portions 236, 237 of spacers 250, 255 increase the contact dimension in the vertical direction. In one embodiment of the invention, the wordline jogs include a 10 nm curvature 236, 237. Thus, a typical 40 nm high (vertical) contact may increase 10 nm in the vertical direction for each 10 nm curvature. For example, with two spacers each including a 10 nm curve away from a straight wordline embodiment, an extra 20 nm may be gained. In other words, the contact may be 60 nm (40+10+10=60 nm) in the vertical direction. The source contacts may have the same dimensions as the drain contacts.

Thus, in light of the foregoing, the SAC process may be implemented at smaller dimensions. For example, NOR flash architecture may be scaled to the 32 nm node.

In one embodiment of the invention a NOR flash memory array may include bitlines (e.g., 215), source lines (e.g., 220), wordlines (e.g., 245, 260, 275) coupled to spacers (e.g., 250, 255, 265, 270), drain contacts (e.g., 202) coupled to bitlines, and source contacts (e.g., 207) coupled to source lines. The spacers may connect to one another to consequently surround and isolate drain contacts (e.g., 202) and source contacts (e.g., 207) in a plane that is perpendicular (i.e., vertical) and parallel (i.e., horizontal) to wordlines. The contacts may directly connect to rounded portions 236, 237 of the spacers 250, 255.

Regarding methods for manufacturing the above embodiments of the invention, traditional techniques known to those of ordinary skill in the art may be employed.

Regarding wordline jog formation, a traditional wiggled or jogged wordline offset may be employed to achieve maximized contact areas for the drain and source contacts. Specifically, during the course of fabricating the contacts, a lithographic pattern that is capable of forming undulating wordlines that jog around contact openings may be employed.

Regarding SAC techniques, the SAC architecture may be implemented in one embodiment of the invention as follows. An oxide film may be formed over the wordlines. The thickness of the oxide film may determine the approximate width of spacers to be formed from the oxide layer. An anisotropic etch may be performed to etch back the oxide layer and form spacers. In another embodiment of the invention, an oxide-nitride-oxide (ONO) ($SiO_2$—$Si_3N_4$—$SiO_2$) tri-layer spacer may be used implementing traditional techniques.

The spacers must be wide enough (e.g., 30 nm) to protect the sides of wordlines (e.g., 245, 260) from both contamination and any possible contact with a conductive material subsequently deposited within a contact opening formed between the spacers. In one embodiment of the invention, the spacers may be jogged (i.e., bent, kinked, wiggled) and include curvature or rounding to the extent that the spacers contact one another in multiple locations to subsequently isolate the future contacts in the vertical and horizontal directions. However, the spacers must be narrow enough to allow sufficient electrical contact between the conductive material used to fill the contact opening (e.g., 202) formed between the spacers and the underlying semiconductor substrate.

With a dielectric material (e.g., oxide) deposited over the wordlines, and with guidance from the spacers, a contact material such as, but not limited to, tungsten may be deposited in the contact openings by depositing a tungsten layer. The tungsten layer may then be polished back leaving tungsten only in the contact openings. Thus, the contact holes function as a form of mask for depositing tungsten in the contact openings. In one embodiment of the invention, silicon may be epitaxially grown in the contact holes to partially fill the holes. A tungsten layer may then be deposited and polished back leaving tungsten only in the contact holes.

Therefore, spacers (e.g., 250, 255) will prevent contacts (e.g., 202, 203, 205, 207) and/or wordlines (245, 260, 275) from shorting. In addition, since dimensions (i.e., horizontal and vertical distances) of the contact opening are defined by the distance between spacers, the contact dimensions are defined by the spacer width rather than the photolithographic technology employed.

Regarding usage of the various embodiments of the invention, the usage is similar to that of traditional flash memories. In other words, erasure of a block of the flash memory array requires that high voltage be supplied to the memory transistors. Voltage control circuitry may contain switches to supply the required voltage levels to the flash memory array during read, program, and erase operations. The programming of the flash memory transistor may be accomplished by applying VPP (12 volts) to a gate, VPP/2 (6 volts) to a drain, and grounding the source of the memory transistor. This process attracts electrons to the floating gate of the memory transistor by hot electron injection. The flash memory transistors may be erased by applying VPP (12 volts) to the source, grounding the gate, and allowing the drain of the transistor to float. The electrons are thus tunneled away from the floating gate. Reading of flash memory transistors may be performed by applying VCC (5 volts or 3 volts) to the gate, grounding the source, and applying 1 volt to the drain. The amount of drain-source current IDS is then sensed to determine whether the transistor is in the programmed or erased state. For one embodiment of the invention, voltage control circuitry may also contain internal power circuits that supply the necessary voltages for operating the flash memory device if the external supply levels are less than the required values.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A NOR flash memory array comprising:
a first pair of parallel address lines;
a second pair of parallel address lines generally perpendicular to said first pair of address lines;
a first pair of spacers extending along said first pair of address lines; and
a contact to one of said second pair of address lines, said contact being completely surrounded by said first pair of spacers.

2. The array of claim 1 including:
a first bitline and a second bitline;
a first source line and a second source line;
a first wordline coupled to a first spacer and a second spacer;
a second wordline coupled to a third spacer and a fourth spacer;
a first drain contact coupled to the first bitline and a second drain contact coupled to the second bitline;
a first source contact coupled to the first source line and a second source contact coupled to the second source line;
wherein the second spacer couples to the third spacer and the second spacer and the third spacer collectively surround the first drain contact in a first plane.

3. The NOR flash array of claim 2, wherein the second spacer directly connects to the third spacer in a first location and a second location and the first drain contact directly connects to the first location and the second location.

4. The NOR flash array of claim 2, wherein the first drain contact directly connects to a rounded portion of the second spacer and to a rounded portion of the third spacer.

5. The NOR flash array of claim 2, wherein the first bit line includes a horizontal diameter and the first drain contact includes a horizontal diameter and a vertical diameter; the first bit line horizontal diameter being less than 60 nm, the first drain contact horizontal diameter being at least 110 nm and the first drain contact vertical diameter being at least 50 nm.

6. The NOR flash array of claim 2, wherein the first drain contact is operatively coupled to four memory cells.

7. The NOR flash array of claim 2, wherein the first source contact is to couple to a virtual ground formed in the NOR flash array.

8. The NOR flash array of claim 2, further comprising:
a third wordline coupled to a fifth spacer and a sixth spacer;
wherein the fourth spacer couples to the fifth spacer and the fourth spacer and the fifth spacer collectively surround the first source contact in the first plane.

9. The NOR flash array of claim 2, wherein the first drain contact is self-aligned in a vertical dimension and a horizontal dimension of the first plane.

10. A method comprising:
forming a first pair of parallel address lines;

forming a second pair of parallel address lines generally perpendicular to said first pair of address lines;

forming a first pair of spacers extending along said first pair of address lines;

forming a contact to one of said second pair of address lines; and completely surrounding said contact by said first pair of spacers.

11. The method of claim 10 including:

forming a first bitline and a second bitline in a memory array;

forming a first source line and a second source line;

forming a first wordline coupled to a first spacer and a second spacer;

forming a second wordline coupled to a third spacer and a fourth spacer;

coupling a first transistor node contact to the first bitline and a second transistor node contact to the second bitline;

coupling the second spacer to the third spacer; and isolating the first transistor node contact in a first plane using the second spacer and the third spacer.

12. The method of claim 11, further comprising forming the second spacer to directly connect to the third spacer in a first location and a second location.

13. The method of claim 11, further comprising directly connecting a rounded portion of the second spacer and a rounded portion of the third spacer to the first transistor node contact.

14. The method of claim 11, further comprising forming the first transistor node contact to operatively couple to four memory cells.

15. The method of claim 11, further comprising selecting a first memory cell by selecting the first wordline, the first bitline, and the first source line.

16. The method of claim 11, further comprising isolating the second transistor node contact in the first plane using the second spacer and the third spacer.

17. The method of claim 11, further comprising forming the second spacer and the third spacer to self-align the first transistor node contact in a vertical dimension and a horizontal dimension of the first plane.

* * * * *